(12) United States Patent
Choi

(10) Patent No.: US 8,675,412 B2
(45) Date of Patent: Mar. 18, 2014

(54) NON-VOLATILE MEMORY DEVICE, METHOD OF OPERATING THE SAME, AND ELECTRONIC DEVICE HAVING THE SAME

(71) Applicant: Yoon-Hee Choi, Hwaseong-si (KR)

(72) Inventor: Yoon-Hee Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/735,355

(22) Filed: Jan. 7, 2013

(65) Prior Publication Data

US 2013/0121083 A1    May 16, 2013

Related U.S. Application Data

(62) Division of application No. 13/191,871, filed on Jul. 27, 2011, now Pat. No. 8,374,035.

(30) Foreign Application Priority Data

Nov. 24, 2010 (KR) .......................... 10-2010-0117562

(51) Int. Cl.
*G11C 16/04* (2006.01)

(52) U.S. Cl.
USPC .................................. 365/185.18; 365/185.25

(58) Field of Classification Search
USPC .......................... 365/185.18, 185.25, 185.24
See application file for complete search history.

(56) References Cited

U.S. PATENT DOCUMENTS

| | | | |
|---|---|---|---|
| 7,440,303 B2 * | 10/2008 | Liaw | ............................... 365/48 |
| 2009/0003072 A1 | 1/2009 | Hwang et al. | |
| 2010/0002507 A1 | 1/2010 | Kang et al. | |
| 2010/0034019 A1 | 2/2010 | Kang et al. | |
| 2010/0124111 A1 | 5/2010 | Suzuki et al. | |

FOREIGN PATENT DOCUMENTS

| | | |
|---|---|---|
| JP | 2010-123201 A | 6/2010 |
| KR | 10-2009-0112082 | 10/2009 |
| KR | 2010-0018318 A | 2/2010 |

* cited by examiner

*Primary Examiner* — Vu Le
(74) *Attorney, Agent, or Firm* — Harness, Dickey & Pierce

(57) ABSTRACT

In one embodiment, the method includes detecting a noise level of a common source line, and adjusting a frequency of program-verify operations on a memory cell during a programming loop based on the detected noise level.

18 Claims, 14 Drawing Sheets

NON-VOLATILE MEMORY DEVICE, METHOD OF OPERATING THE SAME, AND ELECTRONIC DEVICE HAVING THE SAME

PRIORITY INFORMATION

This application is a divisional application of U.S. Ser. No. 13/191,871, filed on Jul. 27, 2011, which claims priority under 35 U.S.C. 119 on Korean Application No. 10-2010-0117562 filed Nov. 24, 2011, the entire contents of each of which are hereby incorporated by reference.

BACKGROUND

Embodiments of the present inventive concepts relate to a non-volatile memory device, and more particularly, to a non-volatile memory device which may adjust frequency of a read operation or a program-verify operation in accordance with a noise level of a common source line, a method of operating the same and an electronic device having the same.

A semiconductor memory device is divided into a volatile memory device and a non-volatile memory device. The volatile memory device includes a dynamic random access memory (DRAM) and a static random access memory (SRAM), and the non-volatile memory device includes a flash memory, an electrically erasable programmable read-only memory (EEPROM) and a resistive memory.

The flash memory includes a memory cell array for storing data. The memory cell array includes a plurality of memory blocks, and each of the plurality of memory blocks includes a plurality of pages. Each of the plurality of pages includes a plurality of memory cells.

The plurality of memory cells are divided into an on-cell and an off-cell, respectively, according to distribution of a threshold voltage. The on-cell is an erased cell and the off-cell is a programmed cell.

A flash memory performs an erase operation on a memory block basis and performs a program operation or a read operation on a page basis.

A flash memory includes a cell string structure. A cell string includes a plurality of transistors connected in series between a string selection transistor connected to a string selection line (SSL) and a ground selection transistor connected to a ground selection line (GSL). The string selection transistor is connected to a bit line and the ground selection transistor is connected to a common source line (CSL).

Each of a plurality of memory cells may be embodied in a single level cell (SLC) for storing a bit or a multi-level cell (MLC) for storing a plurality of bits. The MLC has an erase state and a plurality of program states according to threshold voltages.

It is important that the MLC secures a margin of each of a plurality of program states by narrowing a distribution range of a threshold voltage in a program state. A noise of the CSL causes a distribution range of each of the plurality of program states to expand. The noise of the CSL means that a voltage of the CSL increases due to current flowing in an on-cell during a read operation or a program-verify operation. With an identical word line voltage or an identical bit line voltage, when a voltage level of a source node of a ground selection transistor increases due to a noise of the CSL, a current flowing in an on-cell decreases. This causes a threshold voltage of an on-cell to increase, so that an on-cell may be determined as an off-cell and cause an error during a read operation or a program-verify operation.

SUMMARY

The present invention relates to a method of operating a non-volatile memory device.

In one embodiment, the method includes receiving an operation command, detecting a noise level of a common source line, and adjusting a number of times to perform an operation on a memory cell in response to the operation command based on the detected noise level.

For example, the adjusting step may adjust the number of times to perform a program-verify operation on the memory cell based on the detected noise level if the operation command is a program command. In one embodiment, the adjusting includes first performing a first number of program-verify operations on the memory cell if the detected noise level exceeds a threshold noise level and the operation command is a program command. Here, the first number is greater than one. This embodiment further includes second performing a second number of program-verify operations on the memory cell if the detected noise level does not exceed a threshold noise level and the operation command is a program command. Here, the second number is less than the first number.

As another example, the adjusting adjusts the number of times to perform a read operation on the memory cell based on the detected noise level if the operation command is a read command. In one embodiment, the adjusting includes first performing a first number of read operations on the memory cell if the detected noise level exceeds a threshold noise level and the operation command is a read command. Here, the first number is greater than one. The embodiment further includes second performing a second number of read operations on the memory cell if the detected noise level does not exceed a threshold noise level and the operation command is a read command. Here, the second number is less than the first number.

Another embodiment of the method includes detecting a noise level of a common source line, and adjusting a frequency of program-verify operations on a memory cell during a programming loop based on the detected noise level.

Yet another embodiment of the method includes detecting a noise level of a common source line, and adjusting a frequency of read operations performed on a memory cell in response to a read command based on the detected noise level.

The present invention also relates to a non-volatile memory device.

In one embodiment, the device includes a memory cell array including a plurality of memory cells connected in series between a bit line and a common source line, a detection circuit configured to detect a noise level of a common source line, and a control circuit configured to adjust a number of times to perform an operation on a memory cell in response to an operation command based on the detected noise level.

Embodiments are also directed towards an electronic device, memory card, data storage device, etc. and method of operation associated therewith that incorporate embodiments of the memory device or method of reading according the present invention.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION OF EXAMPLE EMBODIMENTS

Figure 1:
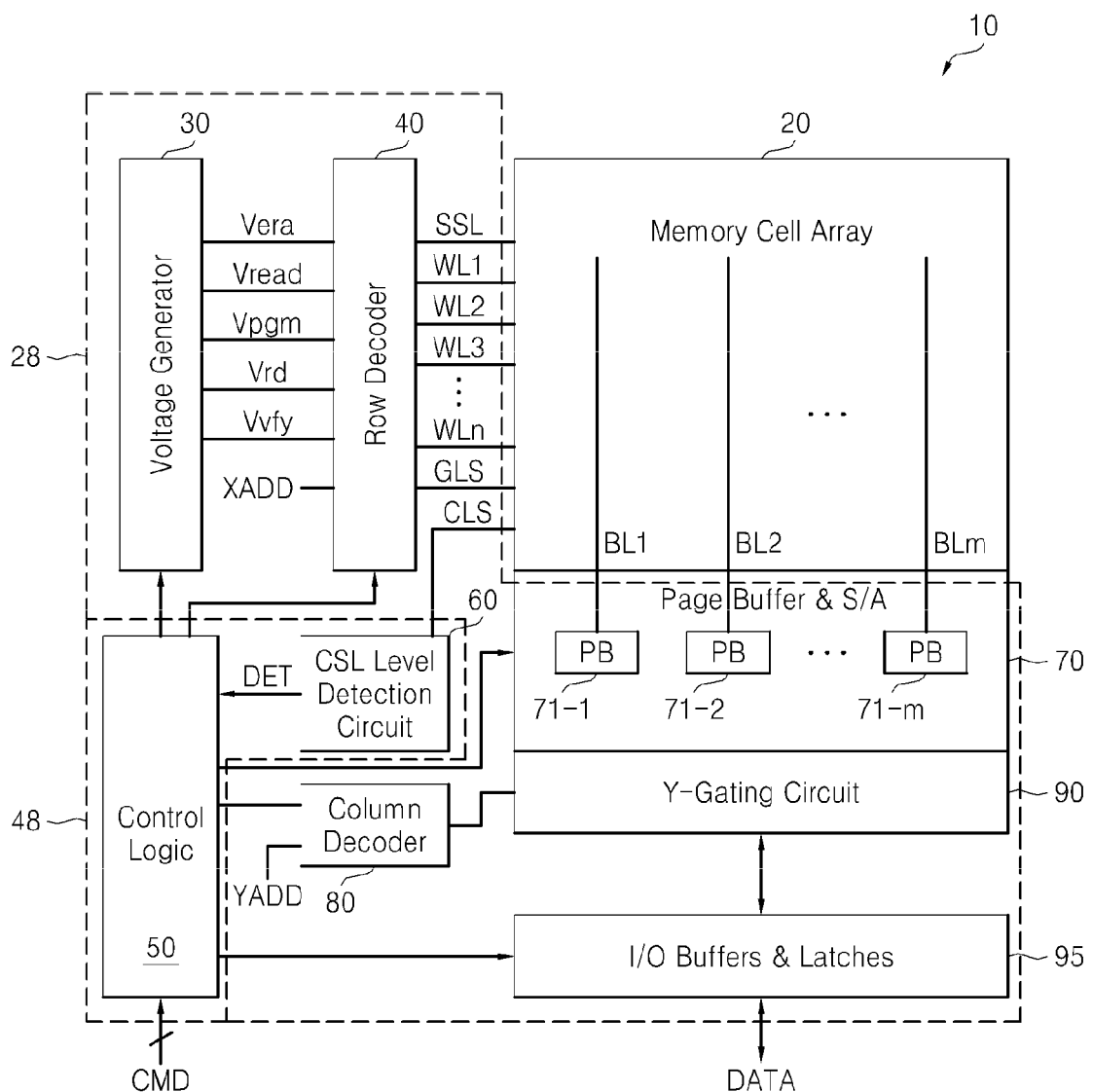
FIG. 1 shows a block diagram of a non-volatile memory device according to an example embodiment of the present invention.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
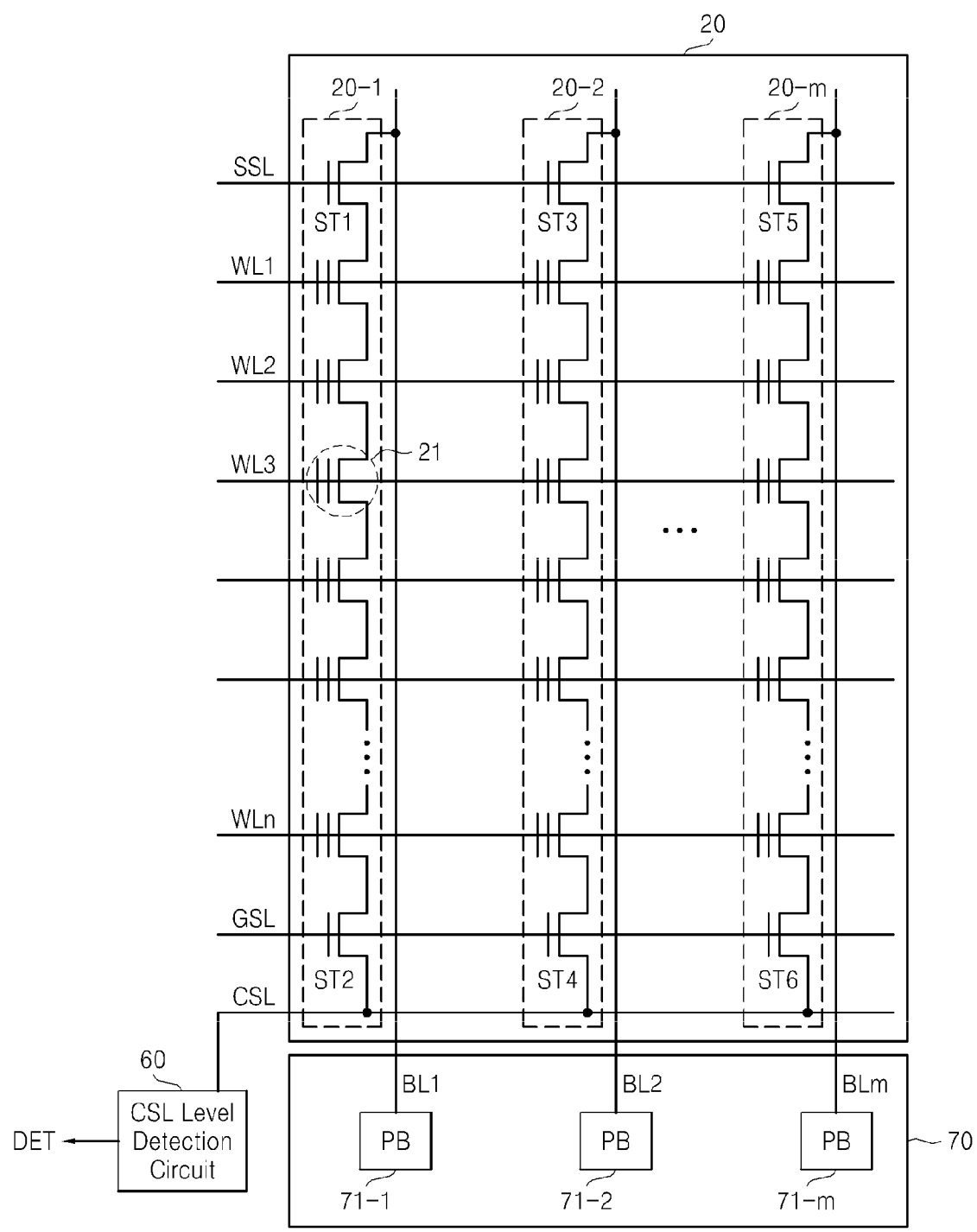
FIG. 2 shows an example embodiment of a memory cell array illustrated in FIG. 1.
Figure 3:
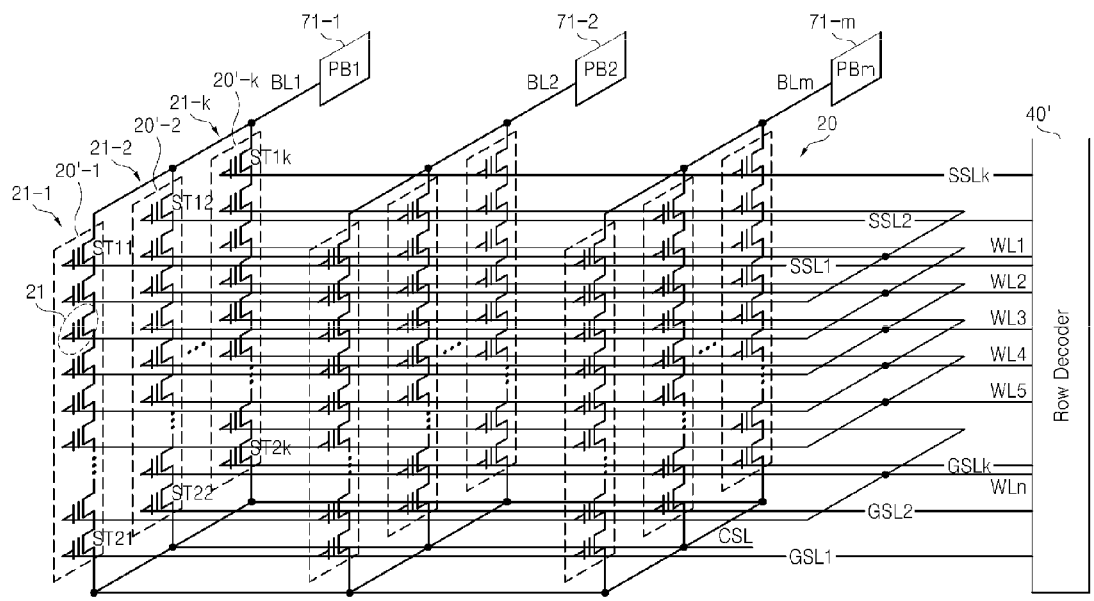
FIG. 3 shows another example embodiment of the memory cell array illustrated in FIG. 1.

FIG. 1 shows a block diagram of a non-volatile memory device according to an example embodiment of the present invention, FIG. 2 shows an example embodiment of a memory cell array illustrated in FIG. 1, and FIG. 3 shows another example embodiment of the memory cell array illustrated in FIG. 1.

Referring to FIGS. 1 and 2, a non-volatile memory device 10 includes a memory cell array 20 for storing data; an access circuit 28 for performing a data access operation on the memory cell array 20 (e.g., a program operation) a read operation or an erase operation; and a control circuit 48 for controlling the data access operation of the access circuit 28.

As shown, the access circuit 28 includes a voltage generator 30, a row decoder 40, a page buffer and sense amplifier (S/A) circuit block 70, a column decoder 80, a Y-gating circuit 90, and input/output (I/O) buffers and latches circuit block 95. The control circuit 48 includes control logic 50 and a command source line (CSL) level detection circuit 60. The above mentioned elements of the access circuit 28 and the control circuit 48 will be described in more detail below.

The memory cell array 20 includes a plurality of cell strings 20-1, 20-2, . . . , 20-*m*, where m is a natural number. Each of the plurality of cell strings 20-1, 20-2, . . . , 20-*m* includes a plurality of non-volatile memory cells connected in series.

As illustrated in FIG. 2, each cell string 20-1, 20-2, . . . , 20-*m* may be arranged (or embodied) on a plane or a layer which is two-dimensionally identical.

FIG. 2 illustrates the memory cell array 20 two-dimensionally arranged, the CSL level detection circuit 60 connected to a common source line (CSL), and the page buffer and sense amplifier block 70.

The cell string 20-1 includes a plurality of non-volatile memory cells connected in series between a first selection transistor (or a string selection transistor) ST1 and a second selection transistor (or a ground selection transistor) ST2. The first string selection transistor ST1 is connected to a bit line BL1, and the second string selection transistor ST2 is connected to the CSL. Each of the other cell strings 20-2 through 20-$m$ have the same structure as the first cell string 20-1, and the description thereof will not be repeated for the sake of brevity. Each of the memory cells 21 has a control gate of the programmable/erasable transistor connected to a word line WL. The gates of the first and second selection transistors ST1 and ST2 are connected to select lines SSL and GSL, respectively.

Each of a plurality of non-volatile memory cells 21 included in each cell string 20-1 to 20-$m$ may be embodied in a flash electrically erasable programmable read-only memory (EEPROM) which may store one-bit or more.

According to an example embodiment, each of the plurality of non-volatile memory cells may be embodied in a NAND flash memory, e.g., a single level cell (SLC) or a multi-level cell (MLC), which may store one-bit or more. Accordingly, each cell string 20-1 to 20-$m$ may be called a NAND cell string.

The CSL level detection circuit 60 detects a noise level of the CSL, compares a detected noise level with a reference level, and generates a detection signal DET according to a comparison result.

The noise level is determined based on a parasitic resistance of a common source line CSL connected to one of a plurality of memory cells.

The page register and sense amplifier block 70 include a plurality of page buffers 71-1 to 71-$m$. Each of the plurality of page buffers 71-1 to 71-$m$ is connected to a corresponding one of the plurality of bit lines BL1 to BLm.

Each of the plurality of page buffers 71-1 to 71-$m$ operates as a driver for programming data in the memory cell array 20 during a program operation according to control of a control logic 50. Moreover, each of the plurality of page buffers 71-1 to 71-$m$ may operate as a sense amplifier which may sense-amplify a voltage level of a corresponding one of the plurality of bit lines BL1 to BLm during a read operation or a verify operation according to the control of the control logic 50.

The verify operation includes a program-verify operation and an erase-verify operation.

For example, during a program operation, each of a plurality of page buffers 71-1 to 71-$m$ performs two program-verify operations at every program loop according to a control of the control logic 50 if a noise level of the CSL is higher than a reference level, and performs only one program-verify operation at every program loop if the noise level is lower than the reference level.

In addition, during a read operation, each of the plurality of page buffers 71-1 to 71-$m$ may perform two read operations according to control of the control logic 50 if a noise level of CSL is higher than a reference level and may perform only one read operation if the CSL noise level is lower than the reference level according to control of the control logic 50.

Accordingly, the control circuit 48 tracks a noise level of the CSL and adjusts the number of a program-verify operation or a read operation according to a tracking result, and an access circuit 28 may perform the program-verify operation or the read operation as many times as the number adjusted by the control circuit 48. Accordingly, the non-volatile memory device 10 may have better performance since it does not need to perform an unnecessary program-verify operation or read operation.

FIG. 3 illustrates an alternative embodiment for the memory cell array 20. Referring to FIG. 3, each cell string 20'-1, 20'-2, . . . , 20'-$k$, where k is a natural number, may be arranged on three-dimensionally each different plane.

As illustrated in FIG. 3, a first cell string 20'1 may be arranged on a first layer 21-1, a second cell string 20'-2 may be arranged on a second layer 21-2 which is different from the first layer 21-1, and a $k^{th}$ string 20'-$k$ may be three-dimensionally arranged on a layer 21-$k$ which is different from the second layer 21-2.

A plurality of layers 21-1 to 21-$k$ may be formed through a wafer stack, a chip stack or a cell stack. Each of the plurality of layers 21-1 to 21-$k$ includes a plurality of cell strings.

A first cell string 20'-1 embodied on a first layer 21-1 includes a plurality of non-volatile memory cells, e.g., NAND flash memory cells, connected in series between a plurality of selection transistors ST11 and ST21.

A second cell string 20'-2 embodied on a second layer 21-2 includes a plurality of non-volatile memory cells, e.g., NAND flash memory cells, connected in series between a plurality of selection transistors ST12 and ST22.

A $k^{th}$ cell string 20'-$k$ embodied on a $k^{th}$ layer 21-$k$ includes a plurality of non-volatile memory cells, e.g., NAND flash memory cells, connected in series between a plurality of selection transistors ST1$k$ and ST2$k$.

This structure may be repeated for each bit line BL1 to BLm where the repeated structures share the same word line WL; selection line SSL, GSL; etc.

In this embodiment, a row decoder 40' replaces the row decoder 40 of FIG. 1. The row decoder 40 is described in greater detail below.

The row decoder 40' may supply each selection signal, e.g., a read voltage Vread during a read operation, a power voltage Vcc during a program operation, or 0V during an erase operation, to each string selection line SSL1 to SSLk connected to each gate of each first selection transistor ST11 to ST1$k$ embodied on each layer 21-1 to 21-$k$. Accordingly, each first selection transistor ST11, ST12, . . . , ST1$k$ may be selectively turned on or off.

The row decoder 40' may supply each selection signal, e.g., a read voltage Vread during a read operation, 0V during a program operation, or 0V during an erase operation, to each ground selection line GSL1, GSL2, . . . , GSLk connected to each gate of each second selection transistor ST21, ST22, . . . , ST2$k$ embodied on each layer 21-1 to 21-$k$. Accordingly, each second selection transistor ST21, ST22, . . . , ST2$k$ may be selectively turned on or off.

As illustrated in FIG. 3, each cell string 20'-1, 20'-2, . . . , 20'-$k$ may share a plurality of word lines WL1 to WLn, CSL and a bit line BL1. That is, each cell string embodied in a corresponding location on each layer 21-1 to 21-$k$ may be connected to each page buffer 71-1 to 71-$m$ embodied in a page register and sense amplifier block 70.

The following explains an operation of a non-volatile semiconductor device 10, assuming that a cell string 20'-1 which is embodied on one of a plurality of layers 21-1 to 21-$k$, e.g., a first layer 21-1, in the three-dimensional memory cell array 20' is selected by a row decoder 40'.

Accordingly, a memory cell array 20 used in the present invention generally shows a two-dimensional memory cell array 20 illustrated in FIG. 2 and a three-dimensional memory cell array 20' illustrated in FIG. 3, and generally shows a row decoder 40 illustrated in FIG. 2 and a row decoder 40' illustrated in FIG. 3.

In addition, a data access operation used in the present invention means a read operation and a verify operation, and the verify operation means a program-verify operation and an erase-verify operation.

Here, the program-verify operation means an operation for determining if a threshold voltage of a selected memory cell after a program operation reaches a required threshold voltage. The erase-verify operation means an operation for determining if a threshold voltage of a selected memory cell reaches a required threshold voltage after an erase operation.

Returning to FIG. 1, the control circuit 48 detects a noise level of the CSL and adjusts a frequency of a data access operation on each of a plurality of memory cells of a memory cell array 20 according to a result of comparing a detected noise level with a reference level.

The control circuit 48 includes a CSL level detection circuit 60 and the control logic 50.

The CSL level detection circuit 60 detects a noise level of the CSL, compares a detected noise level with a reference level, and output a detection signal DET according to a comparison result.

Figure 4:
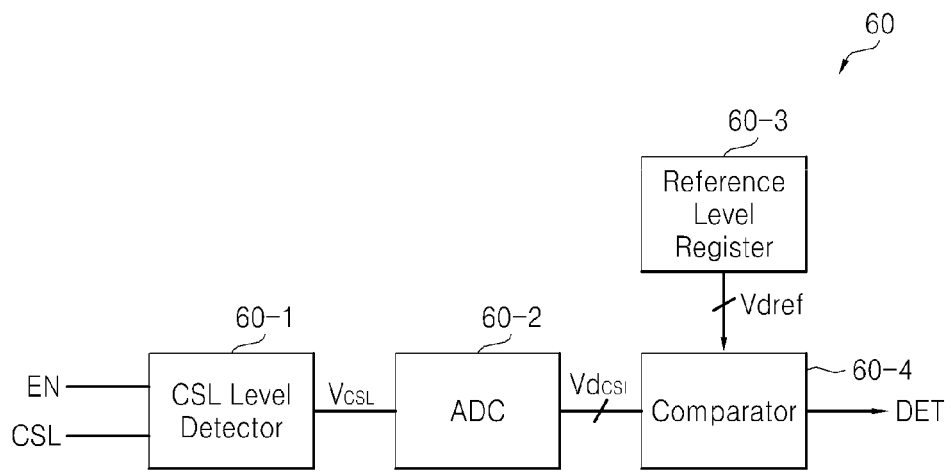
FIG. 4 is a block diagram showing an example embodiment of a common source line level detection circuit illustrated in FIG. 1.

FIG. 4 is a block diagram showing an example embodiment of a common source line level detection circuit illustrated in FIG. 1.

Referring to FIG. 4, the CSL level detection circuit 60 includes a CSL level detector 60-1, an analog to digital converter (ADC) 60-2, a reference level register 60-3, and a comparator 60-4.

The CSL level detector 60-1 detects a noise level of CSL in response to an activated enable signal EN and outputs a detected noise level $V_{CSL}$. When an enable signal EN becomes inactivated, the CSL level detector 60-1 becomes disabled.

The ADC 60-2 converts a detected noise level $V_{CSL}$ into a digital code $Vd_{CSL}$.

The reference level register 60-3 stores a reference code Vdref corresponding to a reference level.

The comparator 60-4 compares the digital code $Vd_{CSL}$ with the reference code Vdref and outputs a detection signal DET corresponding to a comparison result. For example, if a noise level of the CSL is higher than the reference level, the comparator 60-4 outputs a detection signal DET having a first level, e.g., a low level, or a data 0. However, if a noise level of the CSL is lower than or equal to the reference level, the comparator 60-4 outputs a detection signal DET having a second level, e.g., a high level, or a data 1.

According to a level or a data value of a detection signal DET, the control logic 50 adjusts the frequency of a data access operation on each of a plurality of memory cells where a read operation or a program operation is performed.

For example, if the data access operation is a program operation, the control logic 50 may control an operation of an access circuit 28 so that two program-verify operations may be successively performed at every program loop of a current program operation in response to a detection signal DET having a first level or a data 0. The control logic 50 may also control an operation of the access circuit 28 so that a single program-verify operation may be performed at every program loop of the current program operation in response to a detection signal DET having a second level or a data 1.

In addition, when the data access operation is a read operation, the control logic 50 may control an operation of the access circuit 28 so that two read operations may be successively performed during a current read operation in response to a detection signal having a first level or a data 0. The control logic 50 may also control an operation of the access circuit 28 so that a single read operation may be performed during the read operation in response to a detection signal DET having a second level or a data 1.

Figure 5A:
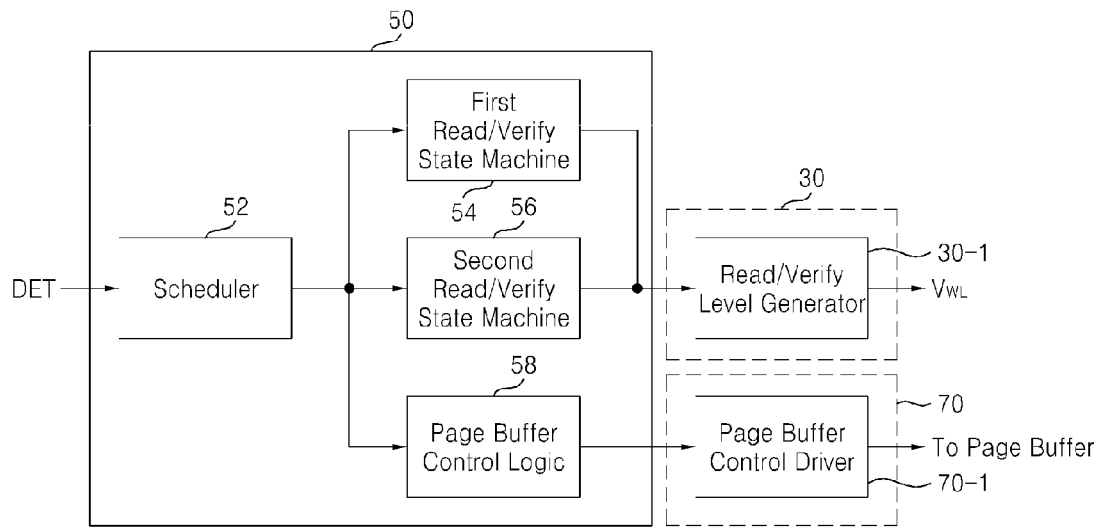
FIG. 5A is a block diagram showing an example embodiment of a control logic illustrated in FIG. 1.

FIG. 5A is a block diagram showing an example embodiment of the control logic illustrated in FIG. 1.

Referring to FIG. 5A, the control logic 50 includes a scheduler 52, a plurality of state machines 54 and 56, and a page buffer control logic 58. For convenience of explanation, FIG. 5A illustrates a voltage generator 30 and a page buffer and sense-amplifier block 70 together with the control logic 50. The control logic 50 may control a data access operation of a non-volatile memory device 10 according to a command CMD input from outside.

The scheduler 52 may control an operation of each of a plurality of state machines 54 and 56 according to a level of the detection signal DET.

For example, if the detection signal DET is a second level or a data 1, the scheduler 52 may enable all of a plurality of states machines 54 and 56.

In addition, if the detection signal DET is a second level or a data 1, the scheduler 52 may enable one of the plurality of state machines 54 and 56, e.g., the state machine 56.

A read/verify level generator 30-1 of the voltage generator 30 generates a word line voltage $V_{WL}$ according to a level setting code output from at least one of the plurality of state machines 54 and 56. The will be described in more detail with respect to FIGS. 6, 8A and 8B below.

Here, the word line voltage $V_{WL}$ includes a program voltage Vpgm supplied to a selected word line among a plurality of word lines during a program operation or a program-verify voltage Vvfy supplied to a selected word line during a program-verify operation.

Moreover, the word line voltage $V_{WL}$ includes a selected word line voltage Vrd supplied to a selected word line among a plurality of word lines or an unselected word line voltage Vread supplied to the unselected word lines, which are not selected from among the plurality of word lines during a read operation corresponding to a single read command.

The scheduler 52 may control an operation of page buffer control logic 58 according to a level of a detection signal DET. For example, if the detection signal DET is a first level or a data 0, the scheduler 52 may control an operation of the page buffer control logic 58 so that two program-verify operations or two read operations may be performed.

In addition, if the detection signal DET is a second level or a data 1, the scheduler 52 may control an operation of the page buffer control logic 58 so that a single program-verify operation or a single read operation may be performed.

A page buffer control driver 70-1 of the page buffer and sense-amplifier block 70 may drive a control signal output from the page buffer control logic 58 to each page buffer 71-1 to 71-m under the control of the control logic 50.

Accordingly, when two program-verify operations or two read operations are successively performed, each page buffer 71-1 to 71-m may sense and amplify a signal of each bit line BL1 to BLm twice, successively according to a control of the buffer control driver 70-1.

Additionally, when a single program-verify operation or a single read operation is performed, each page buffer 71-1 to 71-m may sense-amplify a signal of each bit line BL1 to BLm once according to a control of the buffer control driver 70-1.

The scheduler 52, a plurality of state machines 54 and 56, and the page buffer control logic 58 may be embodied in hardware or software for controlling an operation of the hardware.

Figure 5B:
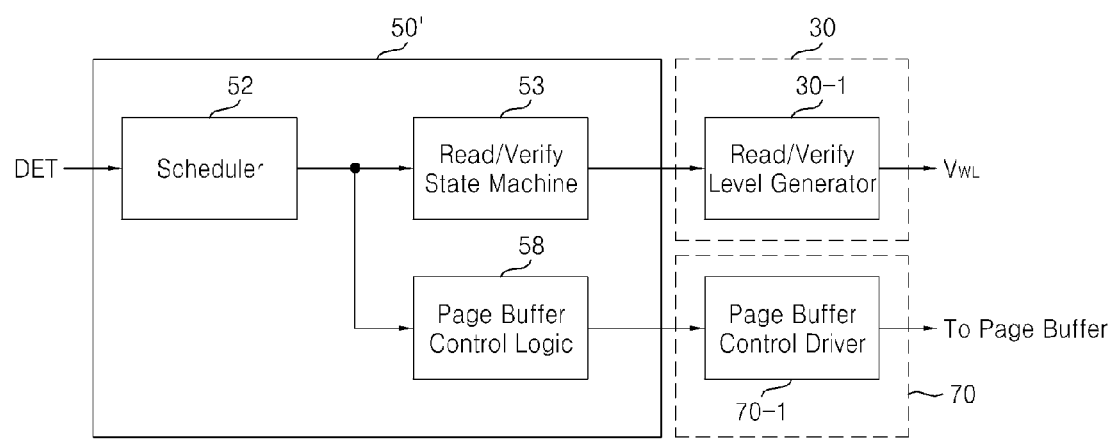
FIG. 5B is a block diagram showing an another example embodiment of a control logic illustrated in FIG. 1.

FIG. 5B is a block diagram showing an another example embodiment of the control logic illustrated in FIG. 1.

Referring to FIG. 5B, the control logic 50' includes a scheduler 52', a state machine 53', and a page buffer control logic 58'. For convenience of explanation, FIG. 5B illustrates a voltage generator 30 and a page buffer and sense-amplifier block 70 together. The control logic 50 may control a data access operation of a non-volatile memory device 10 according to a command CMD input from outside.

The scheduler 52' may control an operation of the state machine 53' according to a level of a detection signal DET.

For example, if a detection signal DET is a first level or a data 0, the scheduler 52' analyzes the detection signal DET having the first level or the data 0 and output a result of the analysis to the state machine 53'. The state machine 53' controls an operation of the read/verify level generator 30-1 of the voltage generator 30 to perform two program-verify operations per program loop or two read operations per single read command based on the result of the analysis.

In addition, if a detection signal DET is a second level or a data 1, the scheduler 52' analyzes the detection signal DET having the second level or the data 1 and outputs a result of the analysis to the state machine 53'. The state machine 53' controls an operation of the read/verify level generator 30-1 of the voltage generator 30 to perform a single program-verify operation per program loop or a single read operation per single read command based on the result of the analysis.

Returning to FIG. 1, the access circuit 28 may access each of a plurality of memory cells of the memory cell array 20 as many times as a frequency of a data access operation adjusted by the control circuit 48.

For example, when the data access operation is a program-verify operation of a program operation, the access circuit 28 may perform the program-verify operation on data programmed in each of the plurality of memory cells as many times as the frequency adjusted by the control circuit 28.

For example, the control circuit 48 adjusts the frequency so that two program-verify operations may be successively performed at every program loop on each of the plurality of memory cells if a noise level of the CSL is higher than a reference level.

In addition, the control circuit 48 adjusts the frequency so that a single program-verify operation may be performed at every program loop on each of the plurality of memory cells if a noise of the CSL is not greater than a reference level.

If the data access operation is a read operation, the control circuit 48 adjusts the frequency so that two read operations may be successively performed on each of the plurality of memory cells if the noise level is higher than the reference level, and adjusts the frequency so that only one read operation on each of the plurality of memory cells may be performed if the noise level is lower than or equal to the reference level.

The voltage generator 30 generates a plurality of voltages including a program voltage Vpgm necessary for performing a program operation, a plurality of voltages including read voltages necessary for performing a read operation, or a plurality of voltages including an erase voltage Vera necessary for performing an erase operation, and outputs voltages necessary for performing each operation to a row decoder 40.

During a program operation, the row decoder 40 supplies a program voltage Vpgm to a word line selected among a plurality of word lines WL1 to WLn, e.g., WL3, in response to a row address XADD, and supplies a pass voltage to the rest or unselected word lines. An incremental step pulse program (ISPP) may be used as the program operation. It is assumed that a non-volatile memory cell 21 connected to a word line WL3 is a selected memory cell.

During a program-verify operation, a row decoder 40 may supply a program-verify voltage Vvfy to a selected word line, e.g., WL3.

During a read operation, the row decoder 40 supplies a selected read voltage Vrd to a selected word line, e.g., WL3, among a plurality of word lines WL1 to WLn and supplies an unselected voltage Vread to the rest or unselected word lines in response to a row address XADD.

The column decoder 80 decodes a column address YADD under control of the control logic 50 and outputs decoding signals to the Y gating circuit 90.

The Y-gating circuit 90 may control a data transmission between the page register and sense-amplifier block 70 and an input/output buffer and latch block 95 in response to decoding signals output from the column decoder 80.

The input/output buffer and latch block 95 may transmit data input from outside to the Y-gating circuit 80 and transmit data output from the Y-gating circuit 90 to the outside through a plurality of input/output pads.

Figure 6:
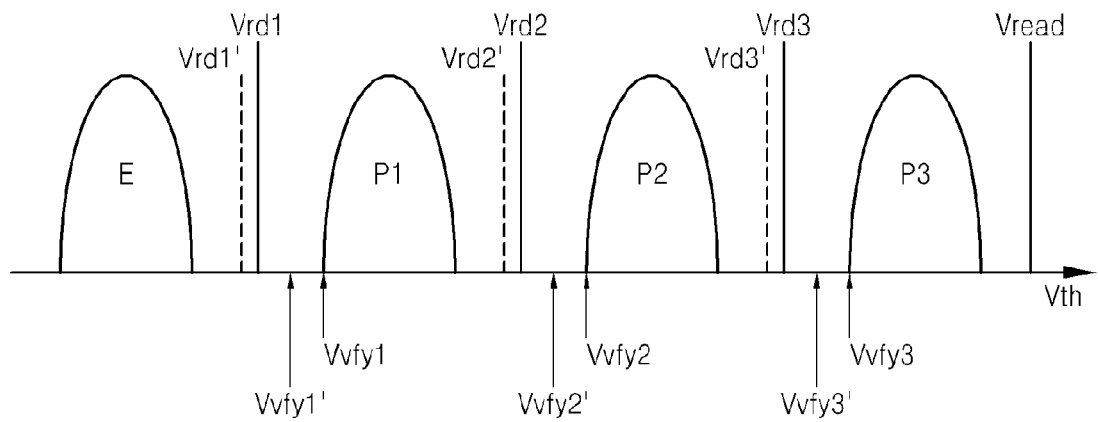
FIG. 6 shows distribution of a threshold voltage of a plurality of non-volatile memory cells included in the memory cell array of FIG. 1, voltages during a read operation and voltages during a program-verify operation.

FIG. 6 shows distribution of threshold voltages of a plurality of non-volatile memory cells included in the memory cell array illustrated in FIG. 1, voltages during a read operation and voltages during a program-verify operation.

Referring to FIG. 6, after a first program-verify voltage Vvfy1', Vvfy2' or Vvfy3' is supplied to a selected word line to perform a first of two program-verify operations at every program loop of a program operation, a second program-verify voltage Vvfy1, Vvfy2 or Vvfy3 is supplied to the selected word line if the detected noise level of the CSL is greater than a reference level.

In addition, the second program-verify voltage Vvfy1, Vvfy2 or Vvfy3 is supplied to a selected word line to perform a single program-verify operation at every program loop of the program operation if the detected noise level of the CSL is not greater than the reference level.

Figure 7A:
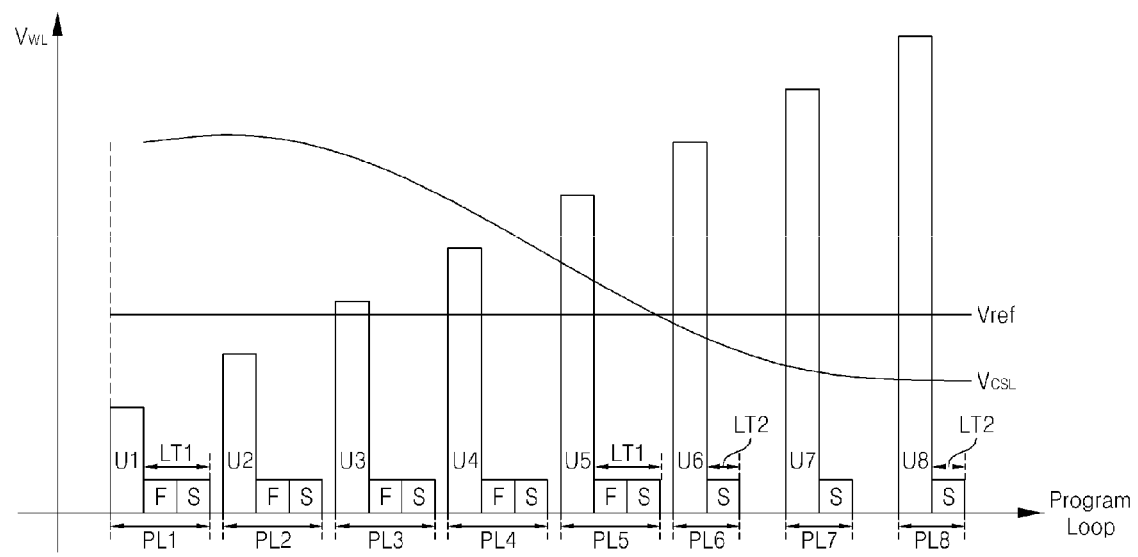
FIGS. 7A-7C are conceptual drawings for explaining a method of adjusting frequency of a program-verify operation based on a result of comparing a noise level of a common source line with a reference level according to an example embodiment of the present invention.
Figure 7B:
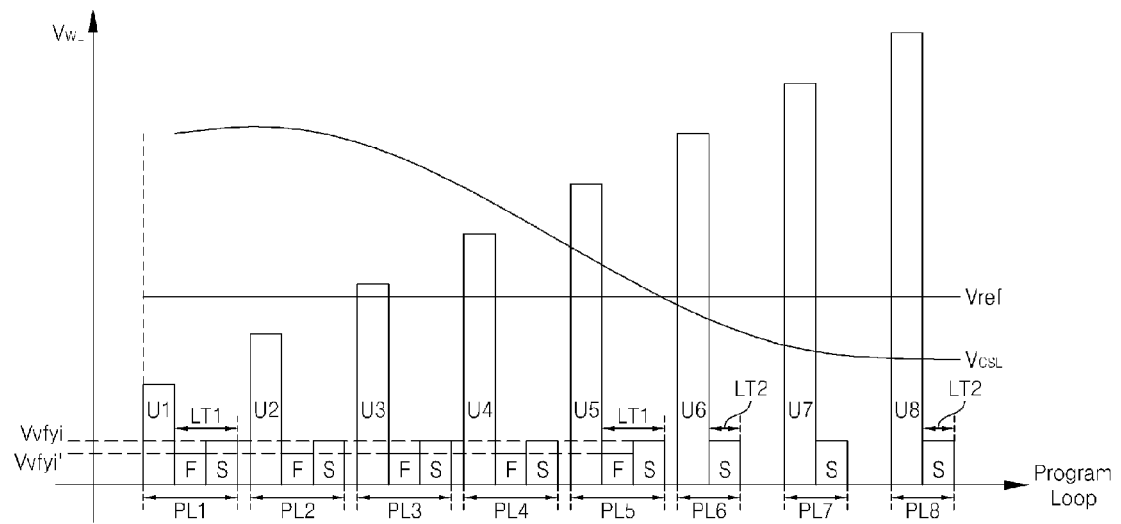

According to an example embodiment, that is showed in FIG. 7B Vvfy1 may be set higher than Vvfy1', Vvfy2 may be set higher than Vvfy2' and Vvfy3 may be set higher than Vvfy3'. According to another example embodiment, that is showed in FIG. 7C Vvfy1 may be set equal to Vvfy1', Vvfy2 may be set equal to Vvfy2' and Vvfy3 may be set equal to Vvfy3'.

Additionally, during a read operation, after a first read voltage Vrd1', Vrd2', or Vrd3' is supplied to a selected word line to perform a first of two read operations, a second read voltage Vrd1, Vrd2, or Vrd3 is supplied to the selected word line if the detected noise level of the CSL is greater than a reference level.

Moreover, during the read operation, the second read voltage Vrd1, Vrd2 or Vrd3 is supplied to a selected word line to perform a single read operation if the detected noise level of the CSL is not greater than the reference level.

According to an example embodiment, Vrd1 may be set higher than Vrd1', Vrd2 may be set higher than Vrd2' and Vrd3 may be set higher than Vrd3'. According to another example embodiment, Vrd1 and Vrd1' may be set the same, Vrd2 and Vrd2' may be set the same, and Vrd3 and Vrd3' may be set the same.

Figure 7C:
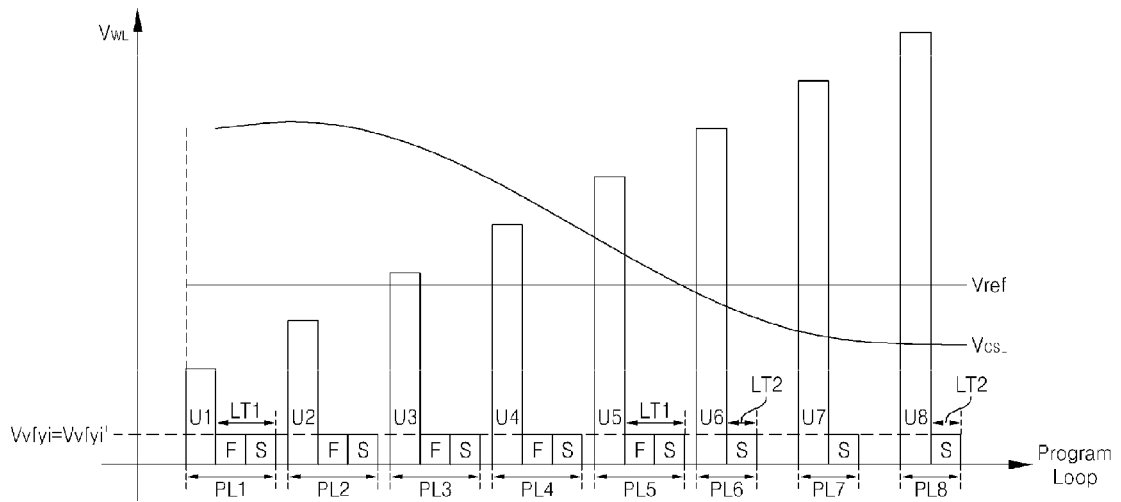
Figure 9:
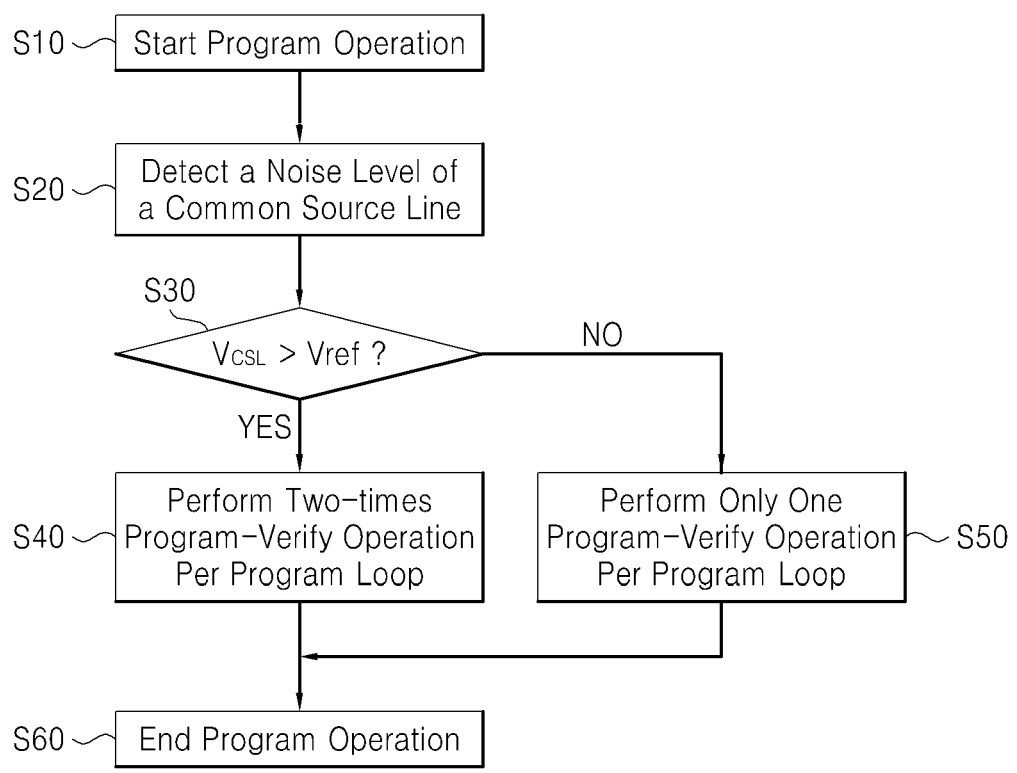
FIG. 9 is a flowchart for explaining a method of adjusting frequency of a program-verify operation based on a result of comparing a noise level of a common source line with a reference level according to an example embodiment of the present invention.

FIGS. 7A to 7C are conceptual diagrams for explaining a method of adjusting frequency of a program-verify operation based on a result of comparing a noise level of a common source line with a reference level according to an example embodiment of the present invention, and FIG. 9 is a flowchart for explaining the method of adjusting frequency of the program-verify operation based on the result of comparing the noise level of the common source line with the reference level according to an example embodiment. In the example of FIGS. 7A-7C, it is assumed that the detected noise on the CSL exceeds the reference level for first through fifth program loops PL1 to PL5, but does not exceed the reference level for sixth through eighth program loops PL6 to PL8.

Referring to FIGS. 1, 2, 3, 4, 5A, 6, 7A, 7B, 7C and 9, a program operation on a non-volatile memory device 10 is performed (S10). The non-volatile memory device 10 receives serial data input command, addresses, data, and program command output from an external source, for example a memory controller or host, and programs the data to a page of the memory cell array 20 according to the addresses and the program command.

The program operation performs a program execution operation and a program-verify operation at each of program loops PL1 to PL8 on the each of states E, P1, P2, and P3. During the program execution operation, a program voltage (or a program pulse) according to ISPP is supplied to a selected word line, and at least a program-verify voltage Vvfy1', Vvfy1, Vvfy2', Vvfy2, Vvfy3' or Vvfy3 is supplied during the program-verify operation.

During the program operation, a CSL level detection circuit 60 detects a noise level of CSL (S20).

The CSL level detection circuit 60 compares a detected noise level $V_{CSL}$ with a reference level Vref and outputs a detection signal DET according to a comparison result (S30).

For example, if the detected noise level $V_{CSL}$ is higher than the reference level Vref, the CSL level detection circuit 60 outputs a detection signal DET having a first level. Subsequently, the scheduler 52 of the control logic 50 enables a plurality of state machines 54 and 56 in response to the detection signal DET having the first level.

Accordingly, the access circuit 28 performs two program-verify operations F and S at every program loop PL1 to PL5 on each of a plurality of memory cells where a program operation is performed (S40).

That is, each of the plurality of state machines 54 and 56 outputs a level setting code under control of the scheduler 52. The scheduler 52 may enable the state machine 54 prior to the state machine 56.

When an enabled state machine 54 outputs a level setting code, the read/verify level generator 30-1 and row decoder 40 output a first program-verify voltage Vvfyi', i is 1, 2, or 3 to a word line voltage $V_{WL}$ during a first program-verify operation F.

The first program-verify voltage Vvfy1', Vvfy2' or Vvfy3' is used to narrow a distribution range of threshold voltages of non-volatile memory cells, which is caused by a noise of CSL.

When an enabled state machine 56 outputs a level setting code, the read/verify level generator 30-1 and row decoder output a second program-verify voltage Vvfyi≥Vvfyi', i is 1, 2 or 3 to a word line voltage $V_{WL}$ during a second program-verify operation S.

However if the detected noise level $V_{CSL}$ is lower than the reference level Vref, the CSL level detection circuit 60 outputs a detection signal DET having a second level. Accordingly, the scheduler 52 of the control logic 50 enables only the state machine 56 in response to the detection signal DET having the second level.

Accordingly in the example of FIGS. 7A-7C, the access circuit 28 performs only a program-verify operation S at every program loop PL6 to PL8 in each of the plurality of memory cells where the program operation is performed (S50).

That is, when an enabled state machine 56 outputs a level setting code, the read/verify level generator 30-1 and row decoder 40 output a second program-verify voltage Vvfy1, Vvfy2 or Vvfy3 to a word line voltage $V_{WL}$ during a program-verify operation S.

The two program-verify operations F and S performed at every program loop PL1 to PL5 are performed successively during a first loop time (LT1), and the single program-verify operation S performed at every program loop PL6 to PL8 is performed during a second loop time (LT2), which is shorter than the first loop time. The first loop time (LT1) means a maximum verify-time at every program loop PL1 to PL5. The second loop time (LT2) means a maximum verify-time at every program loop PL6 to PL8. Accordingly, the control circuit 48 adjusts a maximum verify-time based on a result of comparing a detected noise level with a reference level. For example, LT1=2*LT2.

According to an example embodiment, for example, shown in FIG. 7B each of the two program-verify operations F and S may be performed by using different program-verify voltages Vvfy1' and Vvfy1, Vvfy2 and Vvfy2' or Vvfy3 and Vvfy3'.

According to another example embodiment, for example, shown in FIG. 7C when Vvfy1 is set equal to Vvfy1', Vvfy2 is set equal to Vvfy2' and Vvfy3 is set equal to Vvfy3', each of the two program-verify operations F and S may be performed by using an identical program-verify voltage Vvfy1' and Vvfy1, Vvfy2' and Vvfy2, or Vvfy3' and Vvfy3'.

Time for performing each of the two program-verify operations F and S is the same as the time for performing the single program-verify operation S. That is, LT1=2*LT2.

The plurality of memory cells where the program operation is performed is provided by page.

Figure 8A:
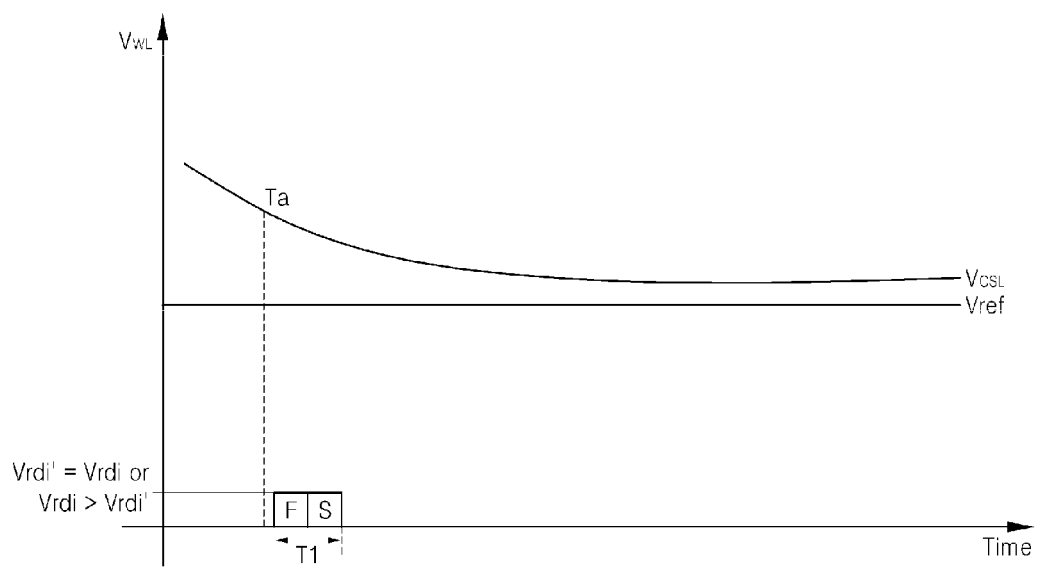
FIGS. 8A and 8B are conceptual drawings for explaining a method of adjusting frequency of a read operation based on a result of comparing a noise level of a common source line with a reference level according to another example embodiment of the present invention.
Figure 8B:
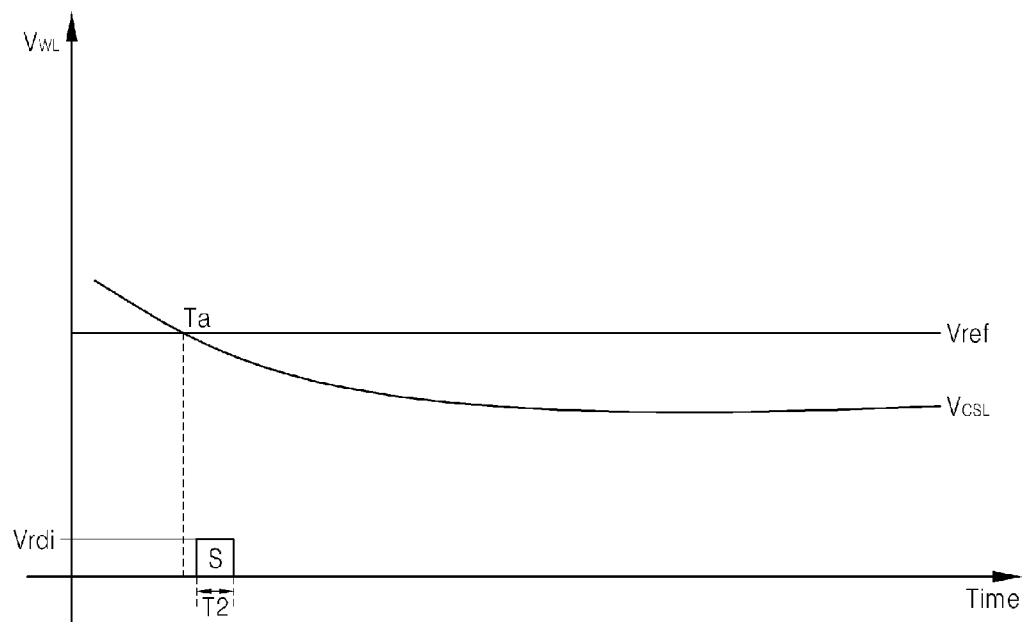
Figure 10:
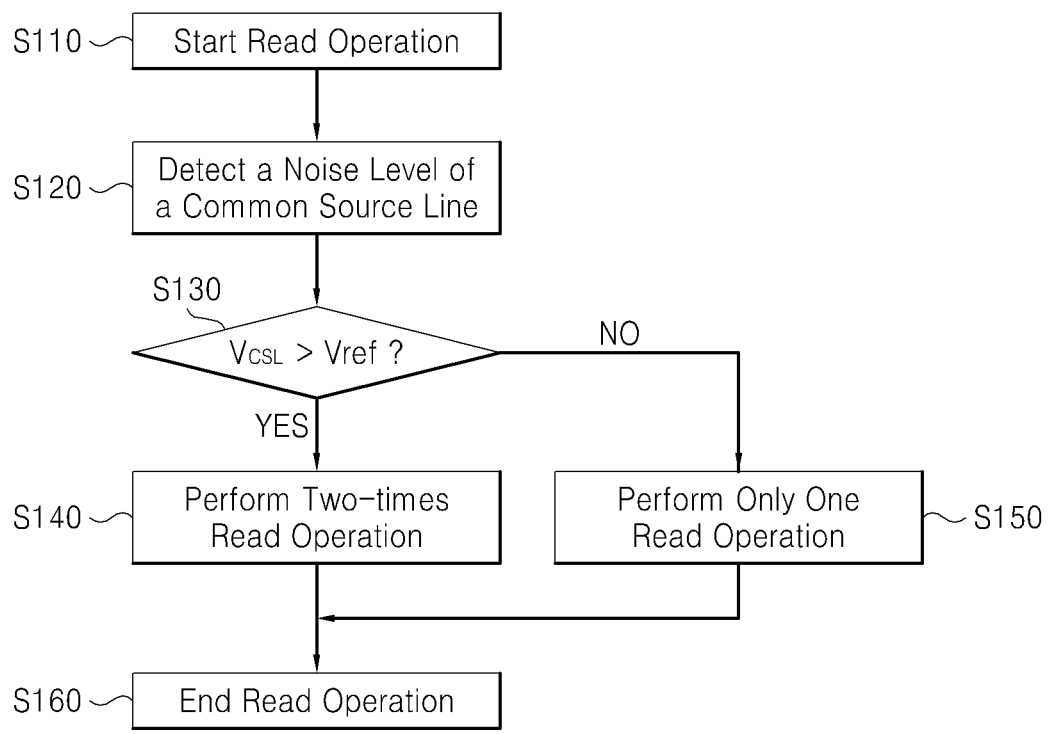
FIG. 10 is a flowchart for explaining a method of adjusting frequency of a read operation based on a result of comparing a noise level of the common source line with a reference level according to another example embodiment of the present invention.

FIGS. 8A and 8B are conceptual diagrams for explaining a method of adjusting frequency of a read operation based on a result of comparing a noise level of a common source line with a reference level according to another example embodiment of the present invention, and FIG. 10 is a flowchart for explaining a method of adjusting frequency of a read operation based on a result of comparing a noise level of a common source line with a reference level according to another example embodiment of the present invention.

Referring to FIGS. 1, 2, 3, 4, 5, 6, 8A, 8B, and 10, a read operation on the non-volatile memory device 10 is performed (S110). The non-volatile memory device 10 receives a read command and addresses output from an external source, for example a memory controller or host, and reads data stored in the memory cell array 20 according to the addresses and the read command.

At a specific time point Ta of a bit line pre-charge operation, a word line pre-charge operation or a read operation, the CSL level detection circuit 60 detects a noise level of CSL (S20).

The CSL level detection circuit 60 compares a detected noise level $V_{CSL}$ with a reference level Vref, and outputs a detection signal DET (S130).

For example, if a detected noise level $V_{CSL}$ is higher than a reference level Vref, the CSL level detection circuit 60 outputs a detection signal DET having a first level. Subsequently, the scheduler 52 of the control logic 50 enables the plurality of state machines 54 and 56 in response to a detection signal DET having a first level.

Accordingly, the access circuit 28 performs two read operations F and S on each of a plurality of memory cells where a read operation is performed successively (S140). This means that the non-volatile memory device 10 performs two read operations according to a single read command CMD.

That is, each of a plurality of state machines 54 and 56 outputs a level setting code according to control of the scheduler 52. The scheduler 52 may enable the state machine 54 prior to the state machine 56.

When the enabled state machine 54 outputs a level setting code, the read/verify level generator 30-1 and row decoder 40 output a first read voltage Vrdi', that is Vrd1', Vrd2' or Vrd3' to a word line voltage $V_{WL}$ during a first read operation F.

When the enabled state machine 56 outputs a level setting code, the read/verify level generator 30-1 and row decoder 40 output a second read voltage Vrdi, that is Vrd1, Vrd2 or Vrd3 to a word line voltage $V_{WL}$ during a second read operation S.

However, if a detected noise level $V_{CSL}$ is lower than or equal to a reference level Vref, the CSL level detection circuit 60 outputs a detection signal DET having a second level. Accordingly, the scheduler 52 of the control logic 50 enables only the state machine 56 in response to a detection signal DET having a second level.

Accordingly, the access circuit performs only one read operation S on each of the plurality of memory cells where the read operation is performed (FIG. 8B and S150).

That is, when the enabled state machine 56 outputs a level setting code, the read/verify level generator 30-1 and row decoder 40 output a second read voltage Vrd1, Vrd2 or Vrd3 to a word line voltage $V_{WL}$ during a read operation S.

During the period when the detected noise level $V_{CSL}$ is higher than a reference level Vref, two read operations F and S are performed successively during a first loop time (T1); and during a period when the detected noise level $V_{CSL}$ is lower than a reference level Vref, only one read operation S is performed during a second loop time (T2), which is shorter than the first loop time (T1). The first loop time (T1) and second loop time (T2) mean maximum read-times. Accordingly, the control circuit 48 adjusts a maximum read-time based on a result of comparing a detected noise level with a reference level. For example, T1=2*T2.

According to an example embodiment, each of the two read operations F and S may be performed by using each different read voltage, Vrd1' and Vrd1, Vrd2' and Vrd2, or Vrd3' and Vrd3.

According to another example embodiment, when Vrd1 and Vrd1' are set the same, Vrd2 and Vrd2' are set the same, and Vrd3 and Vrd3' are set the same, each of the two read operations F and S may be performed by using an identical read voltage Vrd1' and Vrd1, Vrd2' and Vrd2, or Vrd3' and Vrd3.

Time for performing each of the two read operations F and S is the same as time for performing a read operation S.

The plurality of memory cells where the read operation is performed are provided by page.

As described above, the non-volatile memory device 10 may perform a program-verify operation several times per program loop to reduce an error caused by a noise of CSL, however, the non-volatile memory device 10 may perform only one program-verify operation per program loop after the noise becomes lower than a reference value. Accordingly, the non-volatile memory device 10 may reduce the number of program-verify operation.

Furthermore, while the embodiments were described as performing two program or read operations if the detected CSL noise was greater than a threshold, the present invention is not limited to this number. Instead, greater than two program or read operations may be performed. Similarly, while the embodiments were described as performing one program or read operation if the detected CSL noise was not greater than a threshold, the present invention is not limited to this number. Instead, more than one program or read operation may be performed so long as the number is less than the number of program or read operations performed if the detected CSL noise is greater than the threshold.

Figure 11:
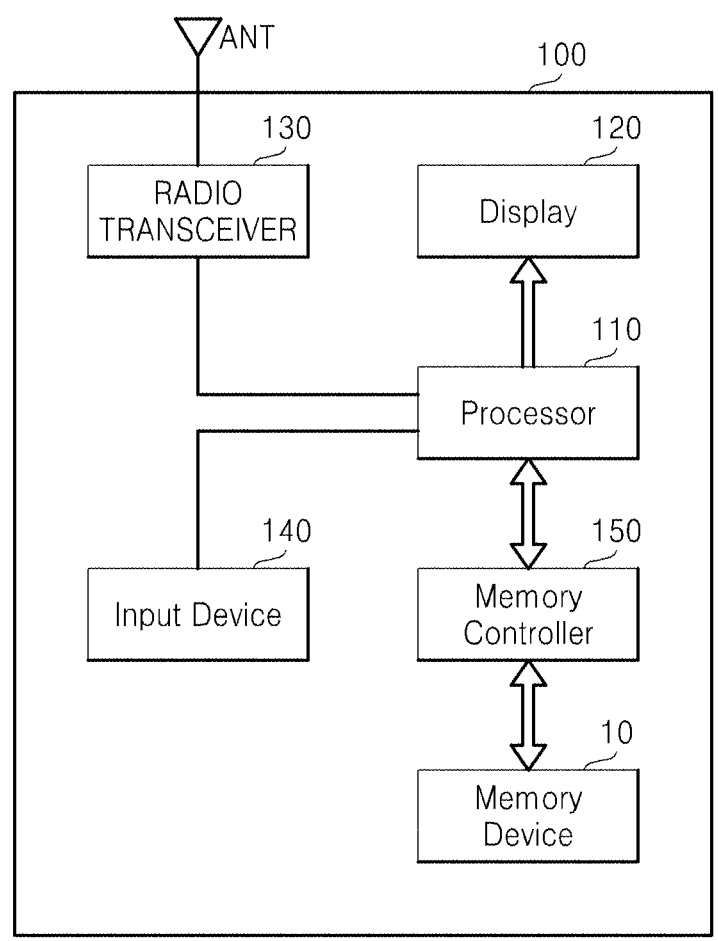
FIG. 11 shows an example embodiment of an electronic device including a non-volatile memory device illustrated in FIG. 1.

FIG. 11 shows an example embodiment of an electronic device including a non-volatile memory device illustrated in FIG. 1. Referring to FIG. 11, the electronic device 100 may be embodied in a cellular phone, a smart phone, a personal digital assistant (PAD) or a wireless internet device.

The electronic device 100 includes the non-volatile memory device 10 and a memory controller 150, which may control an operation of the non-volatile memory device 10 (e.g., supplies the command, address, etc.).

The memory controller 150 may control a data access operation of the non-volatile memory device 10, e.g., a program operation, an erase operation or a read operation, according to a control of the processor 110.

Data programmed in the non-volatile memory device 10 may be displayed through a display 120 according to a processor 110 and control of the memory controller 150.

A wireless transceiver 130 may exchange a wireless signal through an antenna ANT. For example, the wireless transceiver 130 may convert a wireless signal received through an antenna ANT into a signal which may be processed at the processor 110.

Accordingly, the processor 110 may process a signal output from the wireless transceiver 130 and transmit a processed signal to the memory controller 150 or the display 120. The memory controller 150 may store a signal processed by the processor 110 in the non-volatile memory device 10.

Additionally, the wireless transceiver 130 may convert a signal output from the processor 110 into a wireless signal and output a changed wireless signal to an external device through the antenna ANT.

An input device 140 is a device which may input a control signal for controlling an operation of the processor 110 or data to be processed by the processor 110, and may be embodied as a pointing device such as a touch pad and a computer mouse, a keypad a keyboard, etc.

The processor 110 may control an operation of the display 120 so that data output from the wireless transceiver 130 or data output from the input device 140 may be displayed through the display 120.

According to an example embodiment, the memory controller 150, which may control an operation of the non-volatile memory device 10, may be embodied in a part of the processor 110 or a separate chip from the processor 110.

Figure 12:
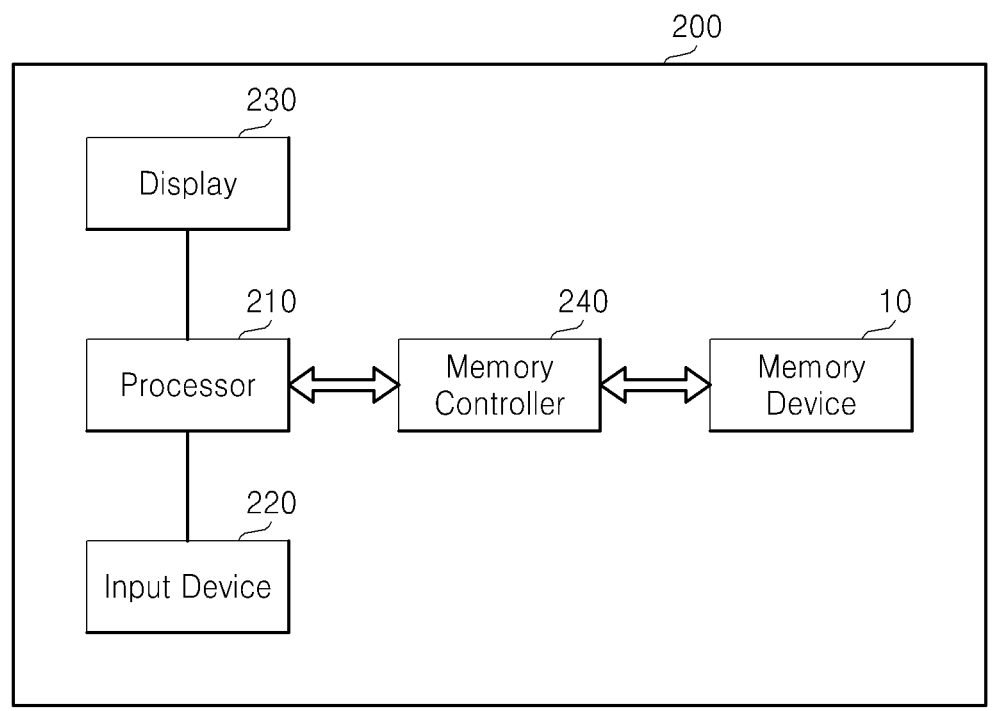
FIG. 12 shows another example embodiment of an electronic device including the non-volatile memory device illustrated in FIG. 1.

FIG. 12 shows another example embodiment of an electronic device including the non-volatile memory device illustrated in FIG. 1. An electronic device 200 illustrated in FIG. 12 may be embodied in a personal computer (PC), a tablet PC, a net-book, an e-reader, a personal digital assistant (PDA), a portable multimedia player (PMP), aMP3 player or a MP4 player.

The electronic device 200 includes the non-volatile memory device 10 and the memory controller 240, which may control a data process operation of the non-volatile memory device 10.

A processor 210 may display data stored in the non-volatile memory device 10 according to data input through an input device 220 through a display 230. For example, the input device 220 may be embodied in a pointing device such as a touch pad or a computer mouse, a keypad, a keyboard, etc.

The processor 210 may control a whole operation of the electronic device 200 and control an operation of the memory controller 240.

According to an example embodiment, the memory controller 240, which may control an operation of the non-volatile memory device 10, may be embodied in a part of the processor 210 or a separate chip from the processor 210.

Figure 13:
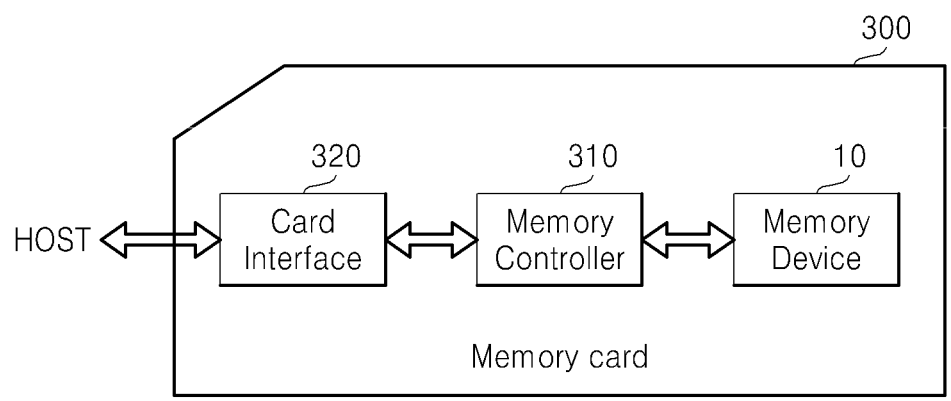
FIG. 13 shows still another example embodiment of an electronic device including the non-volatile memory device illustrated in FIG. 1.

FIG. 13 shows still another example embodiment of an electronic device including the non-volatile memory device illustrated in FIG. 1. An electronic device 300 illustrated in FIG. 13 may be embodied in a memory card or a smart card. The electronic device 300 includes the non-volatile memory device 10, a memory controller 310 and a card interface 320.

The memory controller 310 may control data exchange between the memory device 10 and the card interface 320.

According to an example embodiment, the card interface 320 may be a secure digital (SD) card interface or a multimedia card (MMC) interface, however, it is not restricted thereto.

The card interface 320 may interface data exchange between a host and the memory controller 310 according to a protocol of a host.

According to an example embodiment, the card interface 320 may support an universal serial bus (USB) protocol, an Interchip (IC)-USB protocol. Here, a card interface may mean hardware, that may support a protocol that a host uses, software equipped in the hardware, or a signal transmission method.

When an electronic device 300 is connected to a host such as a PC, a tablet PC, a digital camera, a digital audio player, a cellular phone, a console video game hardware or a digital set-top box, the host may perform a data communication with the non-volatile memory device 10 through the card interface 320 and the memory controller 310.

Figure 14:
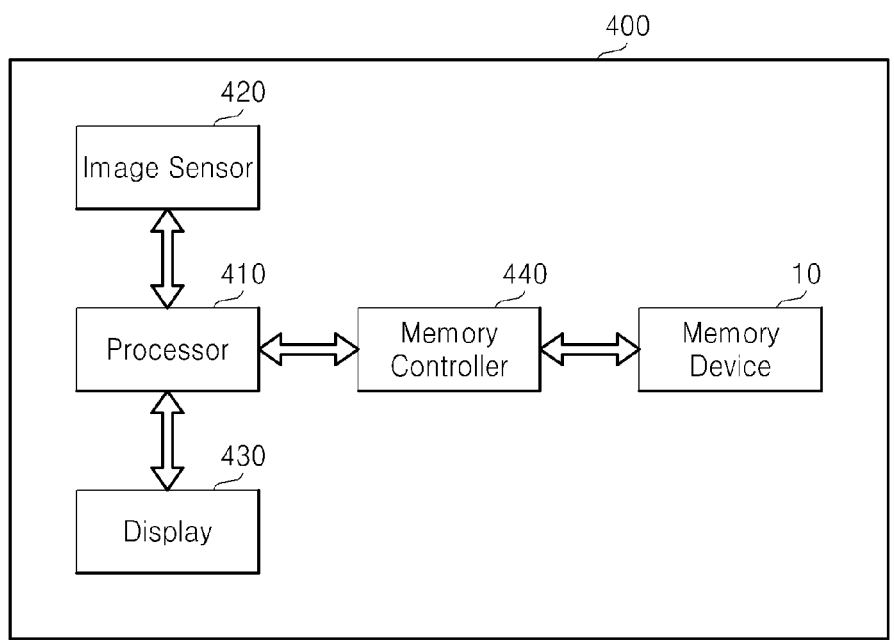
FIG. 14 shows still another example embodiment of an electronic device including the non-volatile memory device illustrated in FIG. 1.

FIG. 14 shows still another example embodiment of an electronic device including the non-volatile memory device illustrated in FIG. 1. An electronic device 400 illustrated in FIG. 14 may be embodied in an image process device, e.g., a digital camera or a cellular phone with a digital camera built-in.

The electronic device 400 includes the non-volatile memory device 10 and a memory controller 440, which may control a data process operation of the non-volatile memory device 10, e.g., a program operation, an erase operation or a read operation.

An image sensor 420 of the memory system 400 converts an optical image into digital signals, and converted digital signals are transmitted to a processor 410 or a memory controller 440. According to control of the processor 410, the converted digital signals may be displayed through a display 430 or stored in the non-volatile memory device 10 through a memory controller 440. In addition, data stored in the non-volatile memory device 10 is displayed through the display 430 according to the processor 410 or a control of the memory controller 440.

According to an example embodiment, the memory controller 440, which may control an operation of the non-volatile memory device 10, may be embodied in a part of the processor 410 or a separate chip from the processor 410.

Figure 15:
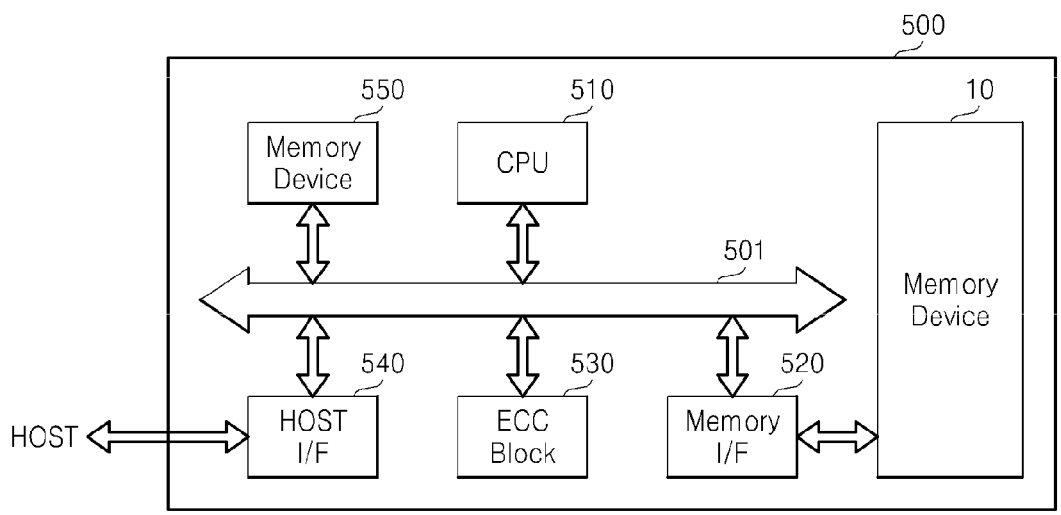
FIG. 15 shows still another example embodiment of an electronic device including the non-volatile memory device illustrated in FIG. 1.

FIG. 15 shows still another example embodiment of an electronic device including the non-volatile memory device illustrated in FIG. 1.

Referring to FIG. 15, an electronic device 500 includes the non-volatile memory device 10 and a central processing unit (CPU) 510, which may control an operation of the non-volatile memory device 10.

The electronic device 500 includes a memory device 550, which may be used as an operation memory of the CPU 510. The memory device 550 may be embodied in a non-volatile memory like a read only memory (ROM) or a volatile memory like Static random access memory (SRAM).

A host connected to the electronic device 500 may perform a data communication with the non-volatile memory device 10 through a memory interface 520 and a host interface 540.

An error correction code (ECC) block 530 may detect an error bit included in data output from the non-volatile memory device 10 through the memory interface 520, correct the error bit, and transmit error-corrected data to a host through the host interface 540 under a control of the CPU 510.

The CPU 510 may control data communication between the memory interface 520, an ECC block 530, the host interface 540 and the memory device 550 through a bus 501.

The electronic device 500 may be embodied in a flash memory drive, a USB memory drive, an IC-USB memory drive or a memory stick.

Figure 16:
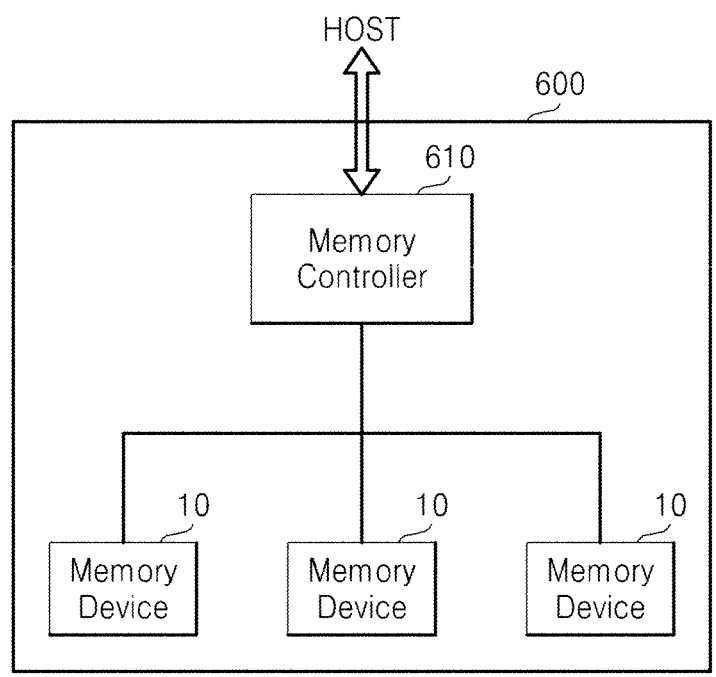
FIG. 16 shows still another example embodiment of an electronic device including the non-volatile memory device illustrated in FIG. 1.

FIG. 16 shows still another example embodiment of an electronic device including the non-volatile memory device illustrated in FIG. 1.

Referring to FIG. 16, an electronic device 600 may be embodied in a processing device such as a solid state drive (SSD). The electronic device 600 may include a plurality of memory devices 10 and a memory controller 610 which may control a data processing operation of each of the plurality of memory devices 10. According to an example embodiment, the electronic device 600 may be embodied in a memory module.

Figure 17:
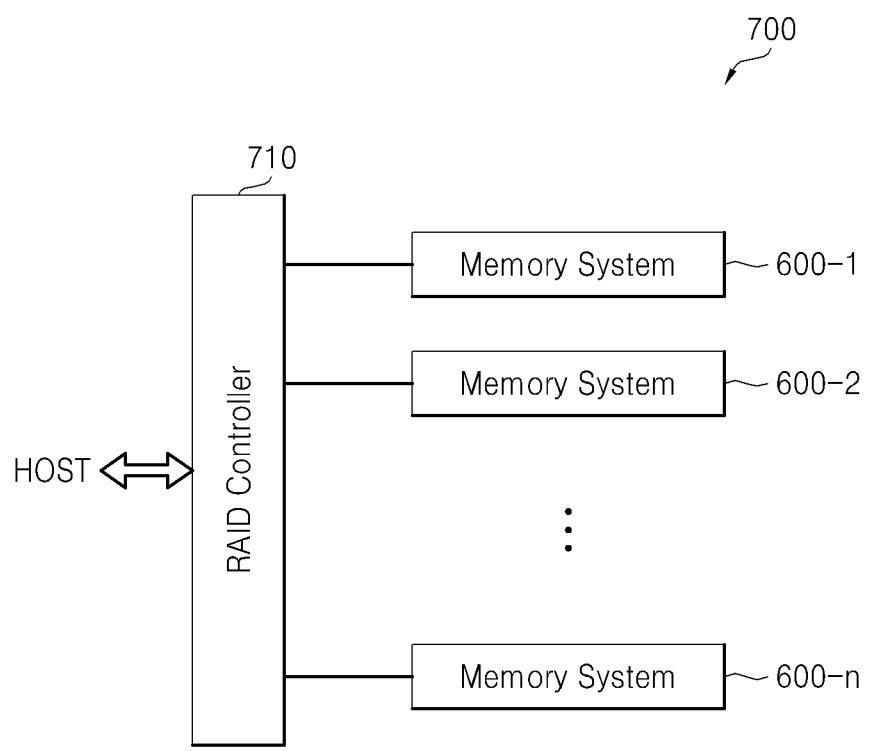
FIG. 17 shows an example embodiment of a data processing device including the electronic device illustrated in FIG. 16.

FIG. 17 shows an example embodiment of a data processing device including an electronic device illustrated in FIG. 16. Referring to FIGS. 16 and 17, a data processing device 700, which may be embodied in a redundant array of independent disks (RAID) system may include a RAID controller 710 and a plurality of electronic devices 600-1 to 600-n, where n is a natural number.

Each of the plurality of electronic devices 600-1 to 600-n may be an electronic device 600 illustrated in FIG. 16. The plurality of electronic devices 600-1 to 600-n may compose a RAID array. The data processing device 700 may be embodied in a personal computer (PC) or a SSD.

During a program operation, a RAID controller 710 may output program data received from a host according to a program command received from the host to at least one of the plurality of electronic devices 600-1 to 600-n based on a RAID level.

During a read operation, the RAID controller 710 may transmit data read by at least one of the plurality of electronic devices 600-1 to 600-n according to a read command output from a host to a host.

To improve performance of a read operation or a program operation, a non-volatile memory device of the present invention may adjust the frequency of the read operation or a program-verify operation according to a result of comparing a noise level of a source line with a reference level.

Accordingly, the non-volatile memory device may reduce errors during a read operation or a program operation.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:
1. A method of programming a memory cell of a non-volatile memory device, comprising:
   detecting a noise level of a common source line;
   adjusting a frequency of program-verify operations on a memory cell during a programming loop based on the detected noise level.

2. The method of claim 1, wherein the adjusting comprises:
first performing more than one program-verify operation on the memory cell if the detected noise level exceeds a threshold noise level.

3. The method of claim 2, wherein each of the more than one program-verify operations uses a different voltage.

4. The method of claim 3, wherein at least one of the more than one program-verify operations uses a higher voltage than a preceding program-verify operation.

5. The method of claim 2, wherein each of the more than one program verify operations uses a same voltage.

6. The method of claim 3, wherein the first performing performs two program-verify operations.

7. The method of claim 6, wherein the adjusting comprises:
second performing one program-verify operation on the memory cell if the detected noise level does not exceed the threshold noise level.

8. The method of claim 7, wherein the second performing is performed in less time than the first performing.

9. The method of claim 8, wherein each of the program-verify operations in the first performing take a same amount of time as the program verify operation in the second performing.

10. The method of claim 1, wherein the adjusting comprises:
first performing a first number of program-verify operations on the memory cell if the detected noise level exceeds a threshold noise level, the first number being greater than one;
second performing a second number of program-verify operations on the memory cell if the detected noise level does not exceed the threshold noise level, the second number being less than the first number.

11. The method of claim 10, wherein each of the first number of program-verify operations uses a different voltage.

12. The method of claim 11, wherein at least one of the first number of program-verify operations uses a higher voltage than a preceding one of the first number of program-verify operations.

13. The method of claim 10, wherein each of the first number of program-verify operations uses a same voltage.

14. The method of claim 10, wherein the second performing is performed in less time than the first performing.

15. The method of claim 10, wherein each of the first number of program-verify operations takes a same first amount of time, each of the second number of program-verify operations takes a same second amount of time, and the first amount of time equals the second amount of time.

16. The method of claim 10, wherein the first number is two and the second number is one.

17. The method of claim 16, wherein each of the first number of program-verify operations in the first performing takes a same amount of time as the program verify operation in the second performing.

18. The method of claim 1, wherein the adjusting adjusts the frequency of the program-verify operations on the memory cell based on the detected noise level and at least one threshold noise level.

* * * * *